United States Patent
Liao

(10) Patent No.: US 11,081,293 B2
(45) Date of Patent: Aug. 3, 2021

(54) MANUFACTURING METHOD OF A COMPOSITE PHOTOVOLTAIC STRUCTURE

(71) Applicant: WAYS TECHNICAL CORP., LTD., Taoyuan (TW)

(72) Inventor: Shih-Wen Liao, Taoyuan (TW)

(73) Assignee: WAYS TECHNICAL CORP., LTD., Taoyuan (TW)

( * ) Notice: Subject to any disclaimer, the term of this patent is extended or adjusted under 35 U.S.C. 154(b) by 0 days.

(21) Appl. No.: 16/925,460

(22) Filed: Jul. 10, 2020

(65) Prior Publication Data

US 2020/0402728 A1 Dec. 24, 2020

Related U.S. Application Data

(62) Division of application No. 16/559,749, filed on Sep. 4, 2019.

(30) Foreign Application Priority Data

Jun. 21, 2019 (TW) .................. 108121856

(51) Int. Cl.
*H01G 9/20* (2006.01)
*H01L 51/00* (2006.01)
(Continued)

(52) U.S. Cl.
CPC ......... *H01G 9/2072* (2013.01); *H01G 9/0036* (2013.01); *H01G 9/204* (2013.01); *H01G 9/2009* (2013.01); *H01G 9/2027* (2013.01); *H01L 27/302* (2013.01); *H01L 51/0007* (2013.01); *H01L 51/0017* (2013.01); *H01L 51/0021* (2013.01); *H01L 51/4253* (2013.01); *H01L 51/442* (2013.01); *H01L 51/004* (2013.01); *H01L 51/0035* (2013.01); *H01L 51/0036* (2013.01); *H01L 51/0037* (2013.01);
(Continued)

(58) Field of Classification Search
CPC .. H01G 9/2072; H01G 9/2009; H01G 9/2027; H01G 9/204; H01G 9/0036; H01L 51/0007; H01L 51/442; H01L 51/0017; H01L 51/0021; H01L 51/4253; H01L 51/0035; H01L 51/0047; H01L 51/0077; H01L 51/0036; H01L 51/0037; H01L 51/004
See application file for complete search history.

(56) References Cited

U.S. PATENT DOCUMENTS 6,198,091 B1 * 3/2001 Forrest .................. B82Y 10/00
136/263
2008/0295889 A1 * 12/2008 Schindler ............ H01L 51/4246
136/263

* cited by examiner

*Primary Examiner* — Matthew T Martin
(74) *Attorney, Agent, or Firm* — Demian K. Jackson; Jackson IPG PLLC

(57) ABSTRACT

A manufacturing method of a composite photovoltaic structure including a step of forming a transparent electrode material, a step of forming a first photovoltaic unit, a step of forming a first insulation layer, a step of forming a first transparent conductive layer, a step of forming a second photovoltaic unit, a step of forming a second insulation layer, a step of forming a second transparent conductive layer and a step of splitting a product. Thus, the manufacturing method of the composite photovoltaic structure has a photoelectric reaction area of a significantly improved omnidirectional concentration gain, an efficiently induced current and a low manufacturing cost, without affecting the whole structure thickness.

15 Claims, 12 Drawing Sheets

(51) Int. Cl.
*H01L 51/42* (2006.01)
*H01L 51/44* (2006.01)
*H01G 9/00* (2006.01)
*H01L 27/30* (2006.01)

(52) U.S. Cl.
CPC ...... *H01L 51/0047* (2013.01); *H01L 51/0077* (2013.01); *H01L 2251/305* (2013.01); *H01L 2251/308* (2013.01)

MANUFACTURING METHOD OF A COMPOSITE PHOTOVOLTAIC STRUCTURE

CROSS REFERENCE

The present invention is Division Application of U.S. patent application Ser. No. 16/559,749 filed on 2019 Sep. 4, and claims priority of TW Patent Application 108121856 filed on 2019 Jun. 21, wherein all contents of the references which priorities are claimed by the present invention are included in the present invention, herein.

BACKGROUND

1. Technical Field

The present disclosure relates to a solar photovoltaic technology, which is dedicated to provide a composite photovoltaic structure having a photoelectric reaction area of a significantly improved omnidirectional concentration gain, an efficiently induced current and a low manufacturing cost, without affecting the whole structure thickness, and to provide a manufacturing method of the composite photovoltaic structure.

2. Related Art

The research of the thin film battery is a direction that people expect from renewable energy. Though the most commercial solar batteries are made of silicon material, the thin film battery is still received with attention from industry and academia since its simple manufacturing process, light weight and flexibility.

When manufacturing the thin film battery, coating is a technical means for producing the thin film of the solar battery, which is benefit to make the thin film more uniform and smoother. Further, reel-to-reel, or called roll-to-roll (R2R) process is a potential technology for massively producing the solar batteries with large areas, and the R2R process is utilized in the industrial of other field. For example, based on softness of flexible displays, the R2R process can incorporate well, such that the displays are produced with lower costs, high molding ability, light weight and shock proof.

There are several kinds of structures of photoelectric conversion devices in the thin film batteries, and one is an organic polymer photovoltaic structure, or perovskite photovoltaic structure, and its related structure is shown in FIG. 1. Mainly, a photovoltaic unit (12) is disposed on a transparent substrate (11), a top surface layer (123) and a bottom surface layer (121) of the photovoltaic unit (12) are respectively a transparent electron transport layer and a transparent hole transfer layer, and a transparent activation layer (122) is disposed between the top surface layer (123) and the bottom surface layer (121).

A top surface of the transparent substrate (11) is disposed with a first transparent electrode layer (131) and a second transparent electrode layer (132). The photovoltaic unit (12) is disposed on the second transparent electrode layer (132), and a transparent conductive layer (141) is stacked on the top surface layer (123) of the photovoltaic unit (12), and electrically connected the first transparent electrode layer (131). An insulation layer (142) is disposed between the photovoltaic unit (12) and the transparent conductive layer (141).

The photovoltaic structure similar to that of FIG. 1 can have the photoelectric conversion of the wide optical spectrum, be operated under process conditions requiring only 180° C. or less, and have the photoelectric conversion under the low illumination. However, under the low illumination, due to the low illuminating source, the induce current is still low even the photovoltaic structure has the high photoelectric conversion efficiency.

SUMMARY

According to one objective of the preset disclosure, the present disclosure provides a composite photovoltaic structure having a photoelectric reaction area of a significantly improved omnidirectional concentration gain, an efficiently induced current and a low manufacturing cost, without affecting the whole structure thickness, and further provides a manufacturing method of the composite photovoltaic structure.

The present disclosure provides a composite photovoltaic structure, comprising: a transparent substrate; a first photovoltaic unit, disposed on the transparent substrate; a second photovoltaic unit, stacked on the first photovoltaic unit, and electrically connected to the first photovoltaic unit in parallel, wherein a top surface layer of the first photovoltaic unit and a bottom surface layer of the second photovoltaic unit are transparent electron transport layers and a bottom surface layer of the first photovoltaic unit and a top surface layer of the second photovoltaic unit are transparent hole transport layers, or alternatively, the top surface layer of the first photovoltaic unit and the bottom surface layer of the second photovoltaic unit are the transparent hole transport layers and the bottom surface layer of the first photovoltaic unit and the top surface layer of the second photovoltaic unit are transparent electron transport layers, transparent activation layers are respectively disposed between the top surface layers and the bottom surface layers of the first photovoltaic unit and the second photovoltaic unit; a first transparent electrode layer and a second transparent electrode layer, disposed on a top surface of the transparent substrate, wherein the first photovoltaic unit is disposed on the second transparent electrode layer, and the bottom surface layer of the first photovoltaic unit contacts the second transparent electrode layer; a first transparent conductive layer, electrically connected to the first transparent electrode layer, disposed on the top surface layer of the first photovoltaic unit, wherein the second photovoltaic unit is disposed on the first transparent conductive layer, and the bottom surface layer of the second photovoltaic unit contacts the first transparent conductive layer; a second transparent conductive layer, electrically connected to the second transparent electrode layer, disposed on top surface layer of the second photovoltaic unit; a first insulation layer, disposed between one side of the first photovoltaic unit and the first transparent conductive layer, wherein the first transparent conductive layer extends to the first transparent electrode layer along the one side of the first photovoltaic unit; and a second insulation layer, disposed between one side of the second photovoltaic unit, one side of the first transparent conductive layer, another side of the first photovoltaic unit and the second transparent conductive layer, wherein the second transparent conductive layer extends to the second transparent electrode layer along the one side of the second photovoltaic unit, the one side of the first transparent conductive layer and the other side of the first photovoltaic unit.

According to the above technical features, the composite photovoltaic structure can have a photoelectric reaction area of a significantly improved omnidirectional concentration gain, an efficiently induced current and a low manufacturing cost, without affecting the whole structure thickness.

According to the above technical features, the composite photovoltaic structure further comprises an optical hardened layer disposed between the top surface of the transparent substrate and the first transparent electrode layer, and between the top surface of the transparent substrate and the second transparent electrode layer According to the above technical features, the first photovoltaic unit and the second photovoltaic unit are organic photovoltaic units.

According to the above technical features, the first photovoltaic unit and the second photovoltaic unit are perovskite photovoltaic units.

According to the above technical features, the first photovoltaic unit is an organic photovoltaic unit, and the second photovoltaic unit is a perovskite photovoltaic unit.

According to the above technical features, the first photovoltaic unit is a perovskite photovoltaic unit, and the second photovoltaic unit is an organic photovoltaic unit.

According to the above technical features, the first photovoltaic unit and the second photovoltaic unit are organic photovoltaic units; the transparent electron transport layers of the first photovoltaic unit and the second photovoltaic unit are mainly made of PEI or PEIE, and preferably have thicknesses of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layers of the first photovoltaic unit and the second photovoltaic unit; the transparent hole transport layers of the first photovoltaic unit and the second photovoltaic unit are mainly made of a combination of PEDOT:PSS (Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably have thicknesses of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layers of the first photovoltaic unit and the second photovoltaic unit; the transparent activation layers of the first photovoltaic unit and the second photovoltaic unit are made of a combination of P3HT/PCBM or a combination of PCPDTBT/PCBM(poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) which is diluted with solvent, and preferably have thicknesses of 100 nm through 500 nm, wherein the combination of P3HT/PCBM is a mixture comprising a polymer semiconductor of a plurality of poly(3-hexylthiophene)(P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layers of the first photovoltaic unit and the second photovoltaic unit.

According to the above technical features, the first photovoltaic unit and the second photovoltaic unit are perovskite photovoltaic units; the transparent electron transport layers of the first photovoltaic unit and the second photovoltaic unit are made of a combination of PEDOT:PSS, or made of P3HT (poly(3-hexylthiophene)) or PTAA (poly(bis (4-phenyl)(2,4,6-trimethylphenyl)amine)), and preferably have thicknesses of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layers of the first photovoltaic unit and the second photovoltaic unit; the transparent hole transport layers of the first photovoltaic unit and the second photovoltaic unit are made of a combination of PDPP3T:PCBM which is diluted with solvent, and preferably have thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layers of the first photovoltaic unit and the second photovoltaic unit; the transparent activation layers of the first photovoltaic unit and the second photovoltaic unit are made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layers of the first photovoltaic unit and the second photovoltaic unit.

According to the above technical features, the first photovoltaic unit is an organic photovoltaic unit, and the second photovoltaic unit is a perovskite photovoltaic unit; the transparent electron transport layer of the first photovoltaic unit is mainly made of PEI or PEIE, and preferably has a thickness of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layer of the first photovoltaic unit; the transparent hole transport layer of the first photovoltaic unit is mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably has a thickness of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layer of the first photovoltaic unit; the transparent activation layer of the first photovoltaic unit is made of a combination of P3HT/PCBM or a combination of PCPDTBT/PCBM (poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) which is diluted with solvent, and preferably has a thickness of 100 nm through 500 nm, wherein the combination of P3HT/PCBM is a mixture comprising a polymer semiconductor of a plurality of poly(3-hexylthiophene)(P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layer of the first photovoltaic unit; the transparent electron transport layer of the second photovoltaic unit is made of a combination of PEDOT:PSS, or made of P3HT (poly(3-hexylthiophene)) or PTAA (poly(bis(4-phenyl)(2,4,6-trimethylphenyl)amine)), and preferably has a thickness of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layer of the second photovoltaic unit; the transparent hole transport layer of the second photovoltaic unit is made of a combination of PDPP3T:PCBM which is diluted with solvent, and preferably has a thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layer of the second photovoltaic unit; the transparent activation layer of the second photovoltaic unit is made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the second photovoltaic unit.

According to the above technical features, the first photovoltaic unit is a perovskite photovoltaic unit, and the second photovoltaic unit is an organic photovoltaic unit; the transparent electron transport layer of the first photovoltaic unit is made of a combination of PEDOT:PSS, or made of P3HT (poly(3-hexylthiophene)) or PTAA (poly(bis(4-phenyl)(2,4,6-trimethylphenyl)amine)), and preferably has a thickness of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layer of the first photovoltaic unit; the transparent hole transport layer of the first photovoltaic unit is made of a combination of PDPP3T:PCBM which is diluted with solvent, and preferably has a thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layer of the first photovoltaic unit; the transparent activation layer of the first photovoltaic unit is made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the first photovoltaic unit; the transparent electron transport layer of the second photovoltaic unit is mainly made of PEI or PEIE, and preferably has a thickness of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layer of the second photovoltaic unit; the transparent hole transport layer of the second photovoltaic unit is mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably has a thickness of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layer of the second photovoltaic unit; the transparent activation layer of the second photovoltaic unit is made of a combination of P3HT/PCBM or a combination of PCPDTBT/PCBM (poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) which is diluted with solvent, and preferably has a thickness of 100 nm through 500 nm, wherein the combination of P3HT/PCBM is a mixture comprising a polymer semiconductor of a plurality of poly(3-hexylthiophene) (P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layer of the second photovoltaic unit.

According to the above technical features, ITO (indium tin oxide), IZO (indium doped zinc oxide) or AZO (aluminum doped zinc oxide) is evaporated or sputtered on the transparent substrate to form the transparent electrode material preferably with a thickness of 50 nm through 200 nm.

According to the above technical features, the first transparent conductive layer is made of Ag, Au, Pt or Pd, and preferably has a thickness of 50 nm through 200 nm, wherein Ag, Au, Pt or Pd is evaporated or sputtered to form the first transparent conductive layer.

According to the above technical features, the second transparent conductive layer is made of Ag, Au, Pt or Pd, and preferably has a thickness of 50 nm through 200 nm, wherein Ag, Au, Pt or Pd is evaporated or sputtered to form the second transparent conductive layer.

According to the above technical features, the optical hardened layer is one or a combination of acrylic, epoxy and silicon dioxide, and preferably has a thickness of 1 μm through 5 μm.

According to the above technical features, the first insulation layer and the second insulation layer are made of polyesters polymer, wherein polyesters polymer is coated and printed, and then dried by hot air for 10 minutes with a temperature of 90° C. through 140° C. to form the first insulation layer and the second insulation layer.

The present disclosure provides a manufacturing method of a composite photovoltaic structure, comprising steps of: a. forming a transparent electrode material, and providing a transparent substrate, wherein the transparent electrode material with a predetermined thickness is disposed on a top surface of the transparent substrate; b. forming a first photovoltaic unit, wherein materials of layers of the first photovoltaic unit are sequentially formed on the transparent electrode material, a top surface layer and a bottom surface layer of the first photovoltaic unit are respectively a transparent electron transport layer and a transparent hole transport layer, and a transparent activation layer is formed between the top surface layer and the bottom surface layer of the first photovoltaic unit; c. forming a first insulation layer, wherein the top surface layer of the first photovoltaic unit is etched to form at least one first insulation material channel which penetrates the transparent electrode material, and the first insulation material channel is filled with insulation material, such that the first insulation layer is formed in the first insulation material channel, and the first insulation layer separates the transparent electrode material into a first transparent electrode layer and a second transparent electrode layer, wherein the first transparent electrode layer is disposed under the first photovoltaic unit, and the second transparent electrode layer is disposed outside the first photovoltaic unit; d. forming a first transparent conductive layer, wherein one side of the first insulation layer is etched to form a first transparent conductive material channel which penetrates the transparent electrode material from the top surface layer of the first photovoltaic unit, and transparent conductive material is disposed on the top surface layer of the first photovoltaic unit and in the first transparent conductive material channel, such that the first transparent conductive layer is formed, wherein the first transparent conductive layer is disposed on the top surface layer of the first photovoltaic unit, extends along the one side of the first insulation layer, and is electrically connected to the first transparent electrode layer; e. forming a second photovoltaic unit, wherein materials of layers of the second photovoltaic unit are sequentially formed on the first transparent conductive layer which is disposed on the first photovoltaic unit, a top surface layer and a bottom surface layer of the second photovoltaic unit are respectively a transparent hole transport layer and a transparent electron transport layer, and a transparent activation layer is disposed between the top surface layer and the bottom surface layer of the second photovoltaic unit; f. forming a second insulation layer, wherein the top surface layer of the second photovoltaic unit is etched to form at least one second insulation material channel which penetrates the transparent electrode material, and the second insulation material channel is filled with insulation material, such that the second insulation layer is formed in the second insulation material channel; g. forming a second transparent conductive layer, wherein one side of the second insulation layer is etched to form a second transparent conductive material channel which penetrates the transparent electrode material from the top surface layer of the second photovoltaic unit, and transparent conductive material is disposed on the top surface layer of the second photovoltaic unit and in the second transparent conductive material channel, such that the second transparent conductive layer is formed, wherein the second transparent conductive layer is disposed on the top surface layer of the second photovoltaic unit, extends along the one side of the second insulation layer, and is electrically connected to the second transparent electrode layer; and h. forming a product of the composite photovoltaic structure, wherein a top surface of the second transparent conductive layer is etched to form a conductive channel which penetrates the transparent electrode material, so as to separate the composite photovoltaic structures on the transparent substrate, wherein the composite photovoltaic structure has the first photovoltaic unit and the second photovoltaic unit stacked on the first photovoltaic unit, and both of them are disposed on the transparent substrate and electrically connected to each other in parallel.

According to the above technical features, an optical hardened layer is disposed on the top surface of the transparent substrate, and the transparent electrode material is disposed on the optical hardened layer.

According to the above technical features, the first photovoltaic unit and the second photovoltaic unit are organic photovoltaic units.

According to the above technical features, the first photovoltaic unit and the second photovoltaic unit are perovskite photovoltaic units.

According to the above technical features, the first photovoltaic unit is an organic photovoltaic unit, and the second photovoltaic unit is a perovskite photovoltaic unit.

According to the above technical features, the first photovoltaic unit is a perovskite photovoltaic unit, and the second photovoltaic unit is an organic photovoltaic unit.

According to the above technical features, the first photovoltaic unit and the second photovoltaic unit are organic photovoltaic units; the transparent electron transport layers of the first photovoltaic unit and the second photovoltaic unit are mainly made of PEI or PEIE, and have thicknesses of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layers of the first photovoltaic unit and the second photovoltaic unit; the transparent hole transport layers of the first photovoltaic unit and the second photovoltaic unit are mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably have thicknesses of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layers of the first photovoltaic unit and the second photovoltaic unit; the transparent activation layers of the first photovoltaic unit and the second photovoltaic unit are made of a combination of P3HT/PCBM or a combination of PCPDTBT/PCBM which is diluted with solvent, and preferably have thicknesses of 100 nm through 500 nm, wherein the combination of P3HT/PCBM is a mixture comprising a polymer semiconductor of a plurality of poly(3-hexylthiophene)(P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layers of the first photovoltaic unit and the second photovoltaic unit.

According to the above technical features, the first photovoltaic unit and the second photovoltaic unit are perovskite photovoltaic units; the transparent electron transport layers of the first photovoltaic unit and the second photovoltaic unit are made of a combination of PEDOT:PSS, or made of P3HT (poly(3-hexylthiophene)) or PTAA (poly(bis(4-phenyl)(2,4,6-trimethylphenyl)amine)), and preferably have thicknesses of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layers of the first photovoltaic unit and the second photovoltaic unit; the transparent hole transport layers of the first photovoltaic unit and the second photovoltaic unit are made of a combination of PDPP3T:PCBM which is diluted with solvent, and preferably have thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layers of the first photovoltaic unit and the second photovoltaic unit; the transparent activation layers of the first photovoltaic unit and the second photovoltaic unit are made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layers of the first photovoltaic unit and the second photovoltaic unit.

According to the above technical features, the first photovoltaic unit is an organic photovoltaic unit, and the second photovoltaic unit is a perovskite photovoltaic unit; the transparent electron transport layer of the first photovoltaic unit is mainly made of PEI or PEIE, and preferably has a thickness of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layer of the first photovoltaic unit; the transparent hole transport layer of the first photovoltaic unit is mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably has a thickness of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layer of the first photovoltaic unit; the transparent activation layer of the first photovoltaic unit is made of a combination of P3HT/PCBM or a combination of PCPDTBT/PCBM(poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) which is diluted with solvent, and preferably has a thickness of 100 nm through 500 nm, wherein the combination of P3HT/PCBM is a mixture comprising a polymer semiconductor of a plurality of poly(3-hexylthiophene)(P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layer of the first photovoltaic unit; the transparent electron transport layer of the second photovoltaic unit is made of a combination of PEDOT:PSS, or made of P3HT (poly(3-hexylthiophene)) or PTAA (poly(bis(4-phenyl)(2,4,6-trimethylphenyl)amine)), and preferably has a thickness of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layer of the second photovoltaic unit; the transparent hole transport layer of the second photovoltaic unit is made of a combination of PDPP3T:PCBM which is diluted with solvent, and preferably has a thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layer of the second photovoltaic unit; the transparent activation layer of the second photovoltaic unit is made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the second photovoltaic unit.

According to the above technical features, the first photovoltaic unit is a perovskite photovoltaic unit, and the second photovoltaic unit is an organic photovoltaic unit; the transparent electron transport layer of the first photovoltaic unit is made of a combination of PEDOT:PSS, or made of P3HT (poly(3-hexylthiophene)) or PTAA (poly(bis(4-phenyl)(2,4,6-trimethylphenyl)amine)), and preferably has a thickness of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layer of the first photovoltaic unit; the transparent hole transport layer of the first photovoltaic unit is made of a combination of PDPP3T:PCBM which is diluted with solvent, and preferably has a thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layer of the first photovoltaic unit; the transparent activation layer of the first photovoltaic unit is made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the first photovoltaic unit; the transparent electron transport layer of the second photovoltaic unit is mainly made of PEI or PEIE, and preferably has a thickness of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layer of the second photovoltaic unit; the transparent hole transport layer of the second photovoltaic unit is mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably has a thickness of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layer of the second photovoltaic unit; the transparent activation layer of the second photovoltaic unit is made of a combination of P3HT/PCBM or a combination of PCPDTBT/PCBM (poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) which is diluted with solvent, and preferably has a thickness of 100 nm through 500 nm, wherein the combination of P3HT/PCBM is a mixture comprising a polymer semiconductor of a plurality of poly(3-hexylthiophene) (P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layer of the second photovoltaic unit.

According to the above technical features, ITO (indium tin oxide), IZO (indium doped zinc oxide) or AZO (aluminum doped zinc oxide) is evaporated or sputtered on the transparent substrate to form the transparent electrode material preferably with a thickness of 50 nm through 200 nm.

According to the above technical features, the first transparent conductive layer is made of Ag, Au, Pt or Pd, and preferably has a thickness of 50 nm through 200 nm, wherein Ag, Au, Pt or Pd is evaporated or sputtered to form the first transparent conductive layer.

According to the above technical features, the second transparent conductive layer is made of Ag, Au, Pt or Pd, and preferably has a thickness of 50 nm through 200 nm, wherein Ag, Au, Pt or Pd is evaporated or sputtered to form the second transparent conductive layer.

According to the above technical features, the optical hardened layer is one or a combination of acrylic, epoxy and silicon dioxide, and has a thickness of 1 μm through 5 μm.

According to the above technical features, the first insulation layer and the second insulation layer are made of polyesters polymer, wherein polyesters polymer is coated and printed, and then dried by hot air for 10 minutes with a temperature of 90° C. through 140° C. to form the first insulation layer and the second insulation layer.

Accordingly, by electrically connecting the first photovoltaic unit and the second photovoltaic unit in parallel on the transparent substrate, the composite photovoltaic structure has a photoelectric reaction area of a significantly improved omnidirectional concentration gain, an efficiently induced current and a low manufacturing cost, without affecting the whole structure thickness.

BRIEF DESCRIPTIONS OF DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTIONS OF EXEMPLARY EMBODIMENTS

Figure 2:
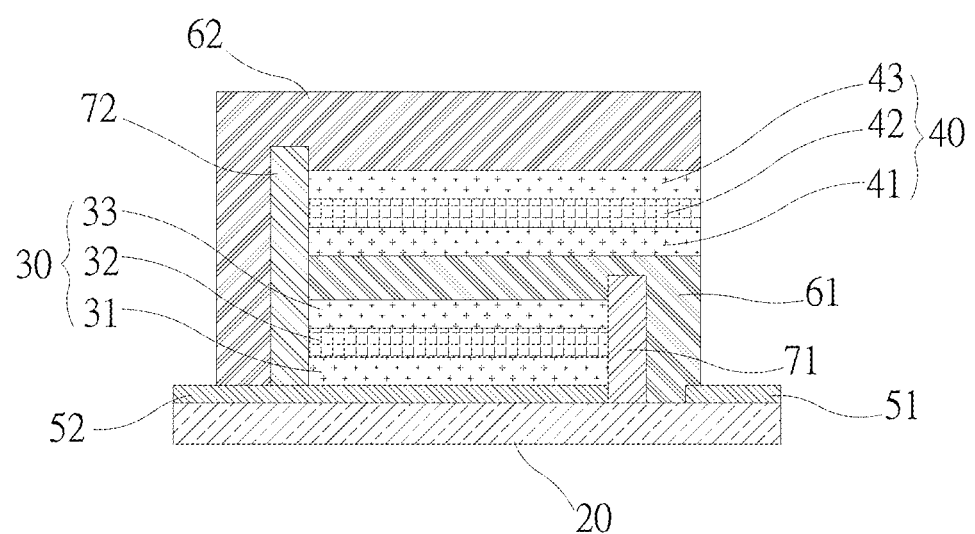
FIG. 2 is a sectional view of a composite photovoltaic structure of a first embodiment of the present disclosure.

The present disclosure provides a composite photovoltaic structure having a photoelectric reaction area of a significantly improved omnidirectional concentration gain, an efficiently induced current and a low manufacturing cost, without affecting the whole structure thickness. As shown in FIG. 2, components of the composite photovoltaic structure of the present disclosure are described as follows. A first photovoltaic unit (30) is disposed on a transparent substrate (20), and a second photovoltaic unit (40) is disposed on the first photovoltaic unit (30) and electrically connected to the first photovoltaic unit (30) in parallel. Top surface layers (33), (43) of the first photovoltaic unit (30) and the second photovoltaic unit (40) are respectively a transparent electron transport layer and a transparent hole transport layer, and bottom surface layers (31), (41) of the first photovoltaic unit (30) and the second photovoltaic unit (40) are respectively a transparent hole transport layers and a transparent electron transport layers, and transparent activation layers (32), (42) are respectively disposed between the top surface layers (33), (43) and the bottom surface layers (31), (41) of the first photovoltaic unit (30) and the second photovoltaic unit (40).

A first transparent electrode layer (51) and a second transparent electrode layer (52) are disposed on a top surface of the transparent substrate (20). The first photovoltaic unit (30) is disposed on the second transparent electrode layer (52), and the bottom surface layer (31) of the first photovoltaic unit (30) contacts the second transparent electrode layer (52). A first transparent conductive layer (61) electrically connected to the first transparent electrode layer (51) is disposed on the top surface layer (33) of the first photovoltaic unit (30).

The second photovoltaic unit (40) is disposed on the first transparent conductive layer (61), and the bottom surface layer (41) of the second photovoltaic unit (40) contacts the first transparent conductive layer (61). A second transparent conductive layer (62) electrically connected to the second transparent electrode layer (52) is disposed on top surface layer (43) of the second photovoltaic unit (40).

A first insulation layer (71) is disposed between one side of the first photovoltaic unit (30) and the first transparent conductive layer (61), wherein the first transparent conductive layer (61) extends to the first transparent electrode layer (51) along the side of the first photovoltaic unit (30). A second insulation layer (72) is disposed between one side of the second photovoltaic unit (40), one side of the first transparent conductive layer (61), another side of the photovoltaic unit (30) and the second transparent conductive layer (62), wherein the second transparent conductive layer

(62) extends to the second transparent electrode layer (52) along the side of the second photovoltaic unit (40), the side of the first transparent conductive layer (61) and other side of the first photovoltaic unit (40).

In principle, when using the composite photovoltaic structure in practice, several composite photovoltaic structures are electrically connected in series to form photovoltaic battery assembly, and atomic layer deposition (ALD) is utilized to spray aluminum oxide and silicon dioxide deposition which forms a gas barrier package, or the glass substrate or transparent plastic substrate is utilized to form the gas barrier package, so as to form the design that the first photovoltaic unit (30) and the second photovoltaic unit (40), both disposed on the transparent substrate (20), are electrically connected to each other in parallel. Thus, without affecting the whole structure thickness, the composite photovoltaic structure has a photoelectric reaction area of a significantly improved omnidirectional concentration gain, an efficiently induced current and a low manufacturing cost, and meets the demand of small size product. By the way, the transparent substrate (20) can be the transparent glass or transparent plastic thin film, such as transparent PET thin film.

Figure 3:
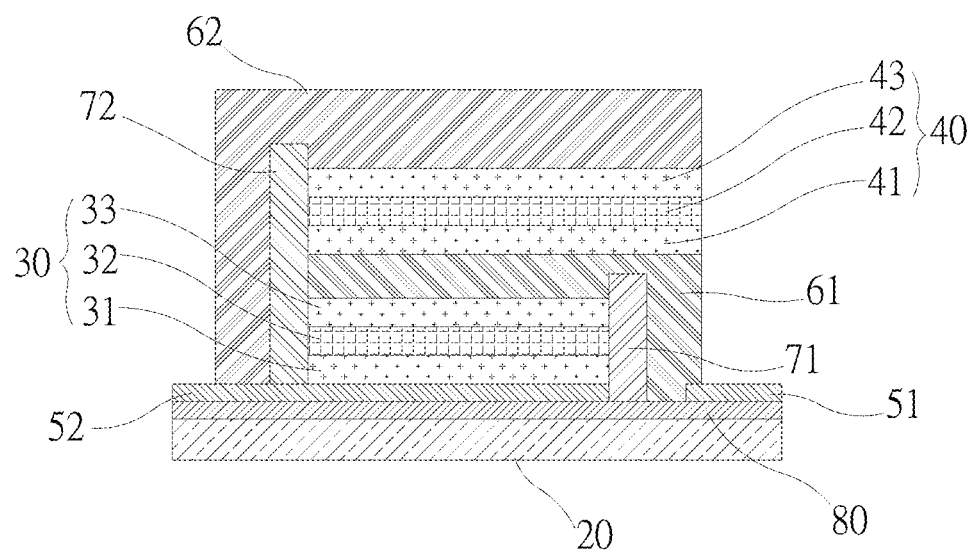
FIG. 3 is a sectional view of a composite photovoltaic structure of a second embodiment of the present disclosure.
Figure 4:
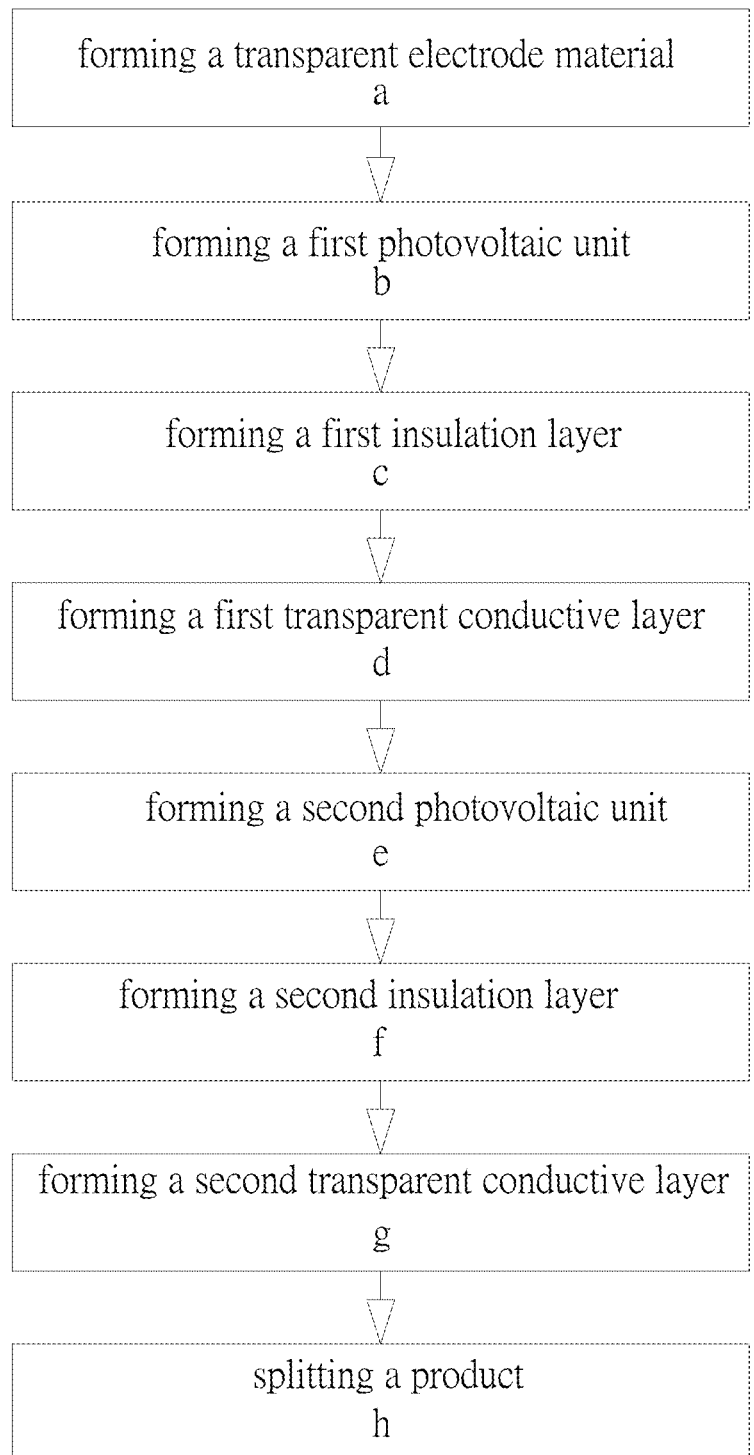
FIG. 4 is a basic flow chart of a method for manufacturing a composite photovoltaic structure.
Figure 5:
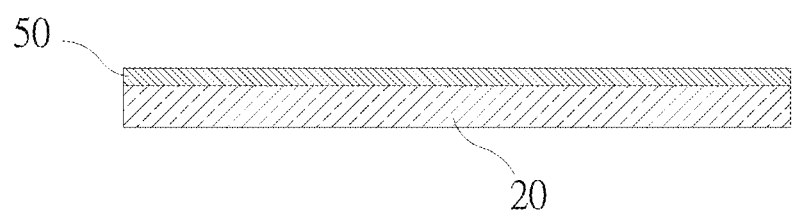
FIG. 5 is a schematic diagram showing the forming completion of the transparent electrode material of the present disclosure.
Figure 6:
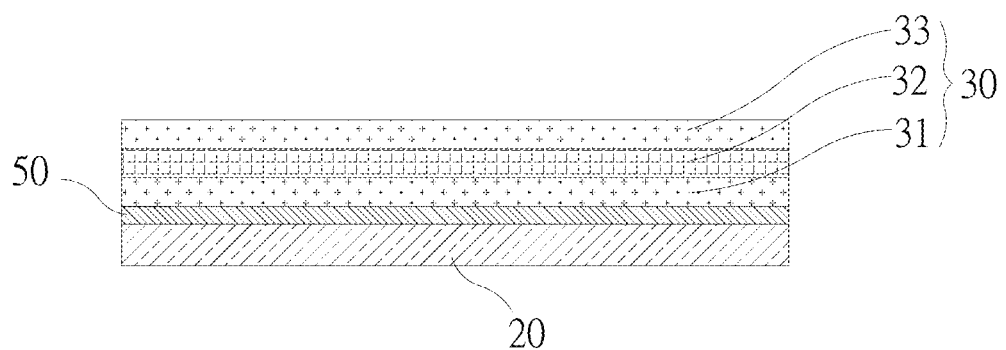
FIG. 6 is a schematic diagram showing the forming completion of the first photovoltaic unit of the present disclosure.
Figure 7:
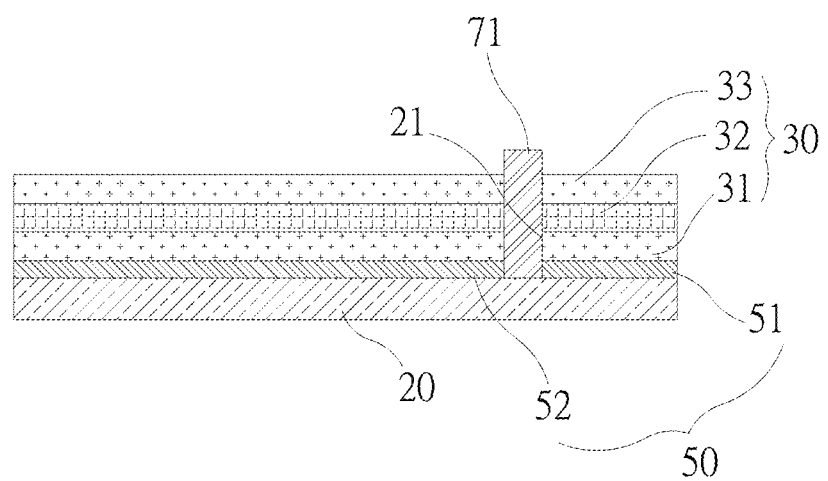
FIG. 7 is a schematic diagram showing the completion of the first insulation layer of the present disclosure.
Figure 8:
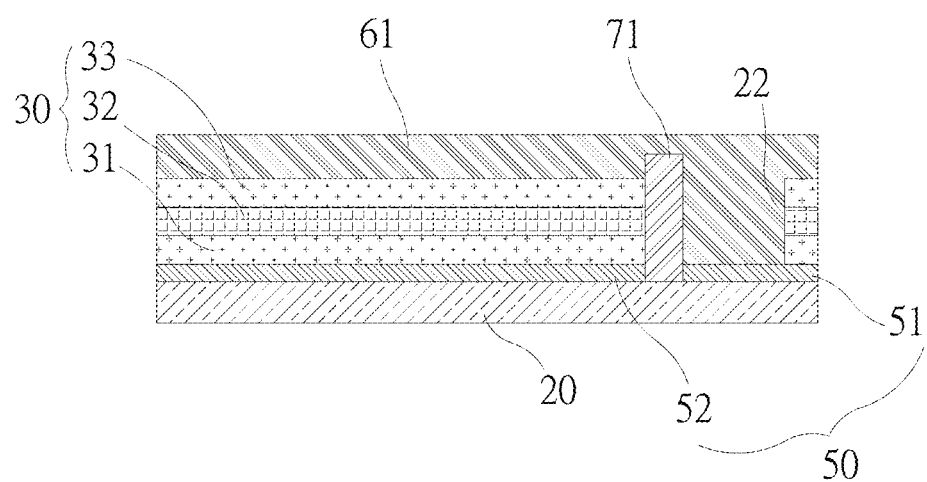
FIG. 8 is a schematic diagram showing the forming completion of the first transparent conductive layer of the present disclosure.
Figure 9:
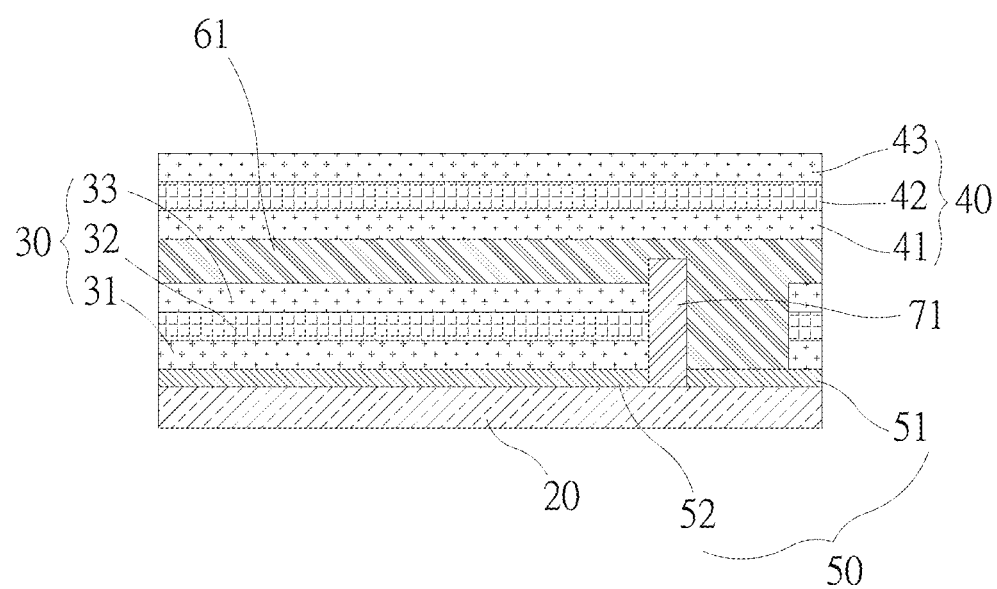
FIG. 9 is a schematic diagram showing the forming completion of the second photovoltaic unit of the present disclosure.
Figure 10:
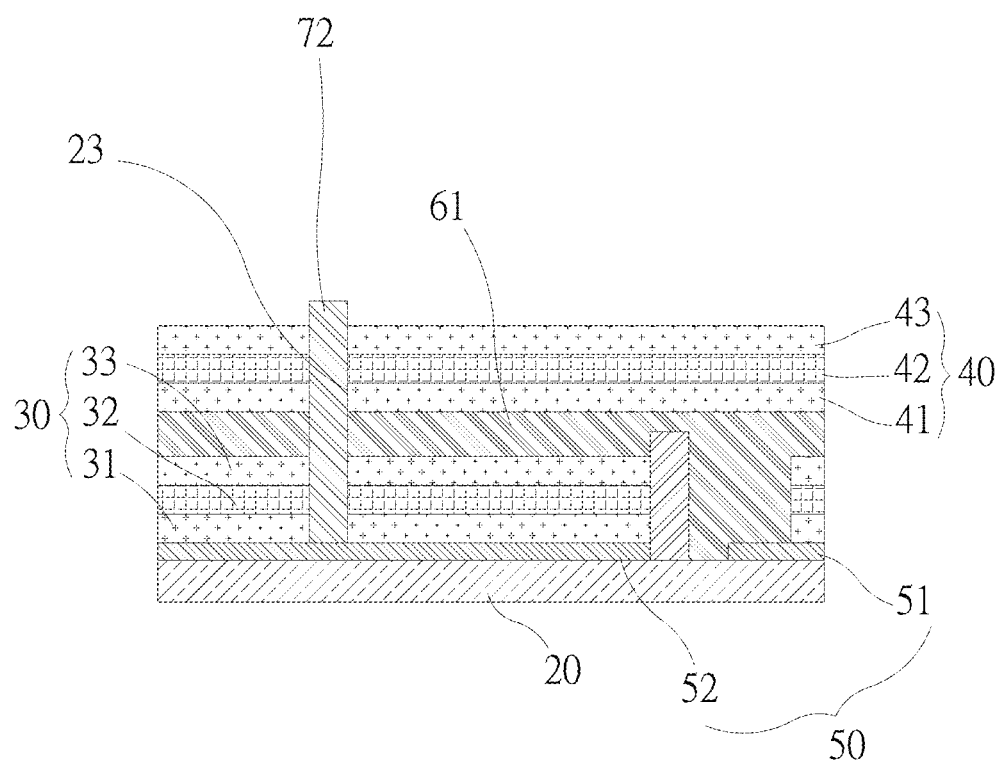
FIG. 10 is a schematic diagram showing the forming completion of the second insulation layer of the present disclosure.
Figure 11:
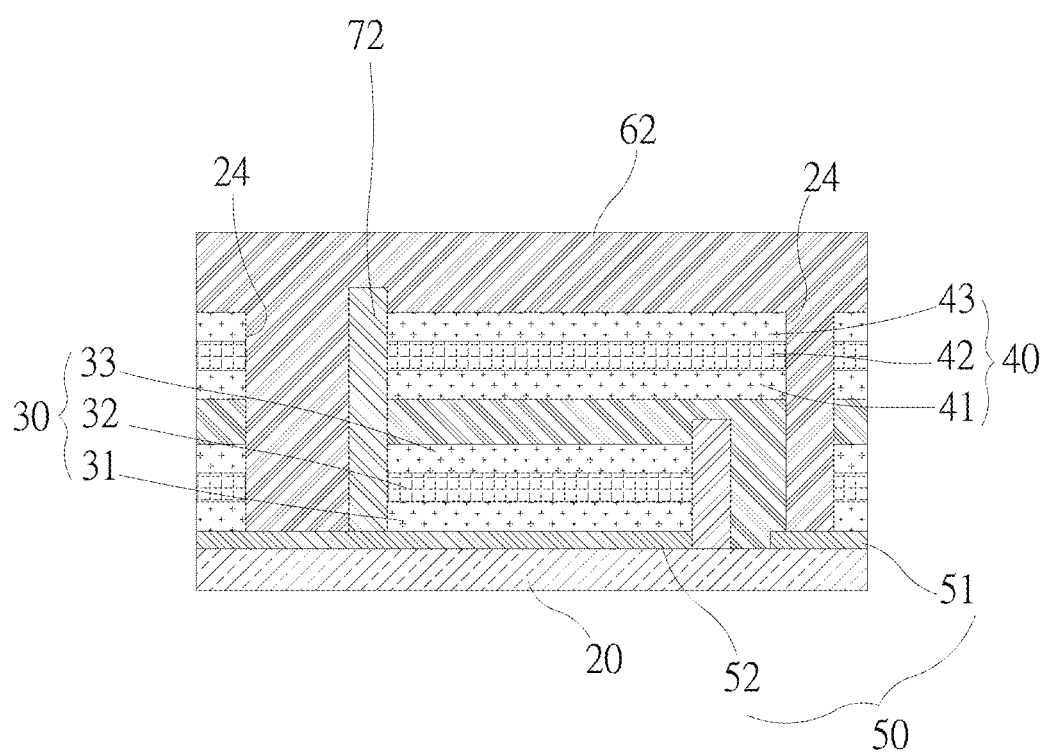
FIG. 11 is a schematic diagram showing the forming completion of the second transparent conductive layer of the present disclosure.
Figure 12:
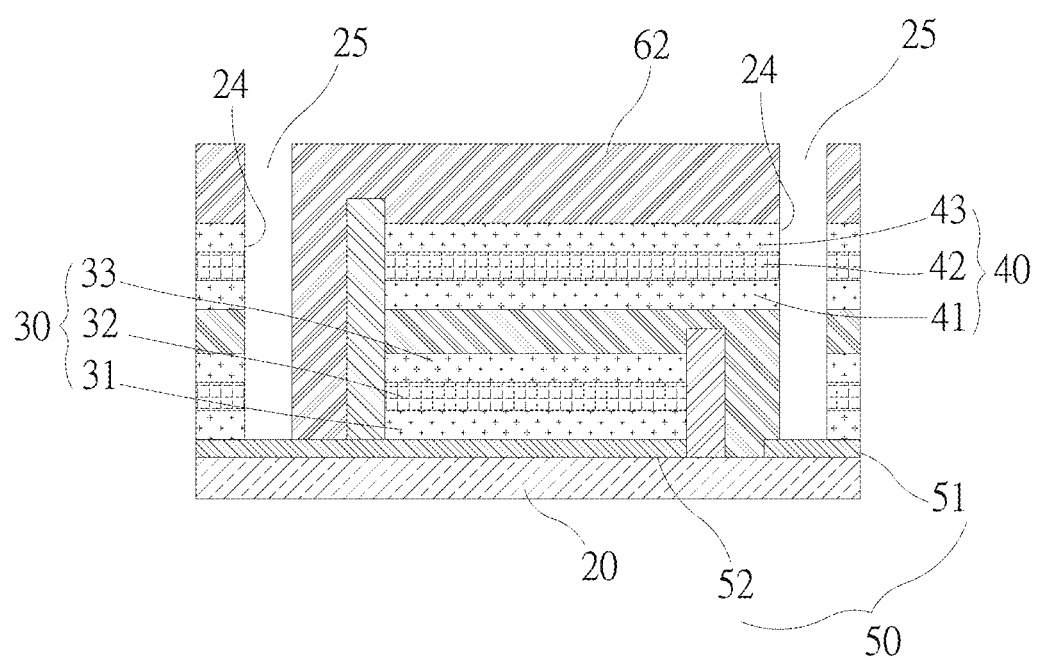
FIG. 12 is a schematic diagram showing the split completion of the first transparent electrode layer and the second transparent electrode layer.

Further, the composite photovoltaic structure of another embodiment can be shown in FIG. 3, an optical hardened layer (80) disposed between the top surface of the transparent substrate (20) and the first transparent electrode layer (51), and between the top surface of the transparent substrate (20) and the second transparent electrode layer (52). In implementation, the optical hardened layer (80) is one or a combination of acrylic, epoxy and silicon dioxide, and preferably has a thickness of 1 μm through 5 μm. By disposing the optical hardened layer (80), the mechanical strength of the composite photovoltaic structure can be increased.

In implementation, the first photovoltaic unit (30) and the second photovoltaic unit (40) are organic photovoltaic units; or alternatively, the first photovoltaic unit (30) and the second photovoltaic unit (40) are perovskite photovoltaic units; or alternatively, the first photovoltaic unit (30) is an organic photovoltaic unit, and the second photovoltaic unit (40) is a perovskite photovoltaic unit; or alternatively, the first photovoltaic unit (30) is a perovskite photovoltaic unit, and the second photovoltaic unit (40) is an organic photovoltaic unit.

It is also noted that, whether the top surface layer of the first photovoltaic unit (30) and the bottom layer of the second photovoltaic unit (40) are the transparent electron transport layers or the transparent hole transport layers can be adjusted according to the actual electrode allocation.

In one embodiment, the first photovoltaic unit (30) and the second photovoltaic unit (40) are organic photovoltaic units. The transparent electron transport layers of the first photovoltaic unit (30) and the second photovoltaic unit (40) are mainly made of PEI or PEIE, and preferably have thicknesses of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layers of the first photovoltaic unit (30) and the second photovoltaic unit (40). The transparent hole transport layers of the first photovoltaic unit (30) and the second photovoltaic unit (40) are mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS) (i.e. the combination of PEDOT and PSS), and preferably have thicknesses of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layers of the first photovoltaic unit (30) and the second photovoltaic unit (40). The transparent activation layers (32), (42) of the first photovoltaic unit (30) and the second photovoltaic unit (40) are made of a combination of P3HT/PCBM (i.e. the combination of P3HT and PCBM) or a combination of PCPDTBT/PCBM (poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) (i.e. the combination of PCPDTBT and PCBM) which is diluted with solvent, and preferably have thicknesses of 100 nm through 500 nm, wherein the combination of P3HT/PCBM is a mixture comprising a polymer semiconductor of a plurality of poly(3-hexylthiophene)(P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layers (32), (42) of the first photovoltaic unit (30) and the second photovoltaic unit (40).

In one another embodiment, the first photovoltaic unit (30) and the second photovoltaic unit (40) are perovskite photovoltaic units. The transparent electron transport layers of the first photovoltaic unit (30) and the second photovoltaic unit (40) are made of a combination of PEDOT:PSS (i.e. the combination of PEDOT and PSS), or made of P3HT (poly(3-hexylthiophene)) or PTAA (poly(bis(4-phenyl)(2,4,6-trimethylphenyl)amine)), and preferably have thicknesses of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layers of the first photovoltaic unit (30) and the second photovoltaic unit (40). The transparent hole transport layers of the first photovoltaic unit (30) and the second photovoltaic unit (40) are made of a combination of PDPP3T:PCBM (i.e. the combination of PDPP3T and PCBM) which is diluted with solvent, and preferably have thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layers of the first photovoltaic unit (30) and the second photovoltaic unit (40). The transparent activation layers of the first photovoltaic unit (30) and the second photovoltaic unit (40) are made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layers of the first photovoltaic unit (30) and the second photovoltaic unit (40).

In one another embodiment, the first photovoltaic unit (30) is an organic photovoltaic unit, and the second photovoltaic unit (40) is a perovskite photovoltaic unit. The transparent electron transport layer of the first photovoltaic unit (30) is mainly made of PEI or PEIE, and preferably has a thickness of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layer of the first photovoltaic unit (30). The transparent hole transport layer of the first photovoltaic unit (30) is mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably has a thickness of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layer of the first photovoltaic unit (30). The transparent activation layer of the first photovoltaic unit (30) is made of a combination of P3HT/PCBM or a combination of PCPDTBT/PCBM (poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) which is diluted with solvent, and preferably has a thickness of 100 nm through 500 nm, wherein the combination of P3HT/PCBM is a mixture comprising a polymer semiconductor of a plurality of poly(3-hexylthiophene) (P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layer of the first photovoltaic unit (30). The transparent electron transport layer of the second photovoltaic unit (40) is made of a combination of PEDOT:PSS, or made of P3HT (poly(3-hexylthiophene)) or PTAA (poly(bis(4-phenyl)(2,4,6-trimethylphenyl)amine)), and preferably has a thickness of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layer of the second photovoltaic unit (40). The transparent hole transport layer of the second photovoltaic unit (40) is made of a combination of PDPP3T:PCBM which is diluted with solvent, and preferably has a thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layer of the second photovoltaic unit (40). The transparent activation layer (42) of the second photovoltaic unit (40) is made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the second photovoltaic unit (40).

In one another embodiment, the first photovoltaic unit (30) is a perovskite photovoltaic unit, and the second photovoltaic unit (40) is an organic photovoltaic unit. The transparent electron transport layer of the first photovoltaic unit (30) is made of a combination of PEDOT:PSS, or made of P3HT (poly(3-hexylthiophene)) or PTAA (poly(bis(4-phenyl)(2,4,6-trimethylphenyl)amine)), and preferably has a thickness of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layer of the first photovoltaic unit (30). The transparent hole transport layer of the first photovoltaic unit (30) is made of a combination of PDPP3T:PCBM which is diluted with solvent, and preferably has a thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layer of the first photovoltaic unit (30). The transparent activation layer (32) of the first photovoltaic unit (30) is made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the first photovoltaic unit (30). The transparent electron transport layer of the second photovoltaic unit (40) is mainly made of PEI or PEIE, and preferably has a thickness of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layer of the second photovoltaic unit (40). The transparent hole transport layer of the second photovoltaic unit (40) is mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably has a thickness of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layer of the second photovoltaic unit (40). The transparent activation layer (42) of the second photovoltaic unit (40) is made of a combination of P3HT/PCBM or a combination of PCPDTBT/PCBM (poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) which is diluted with solvent, and preferably has a thickness of 100 nm through 500 nm, wherein the combination of P3HT/PCBM is a mixture comprising a polymer semiconductor of a plurality of poly(3-hexylthiophene)(P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layer of the second photovoltaic unit (40).

In implementation, ITO (indium tin oxide), IZO (indium doped zinc oxide) or AZO (aluminum doped zinc oxide) is evaporated or sputtered on the transparent substrate (20) to form the first transparent electrode layer (51) and the second transparent electrode layer (52), which preferably have thicknesses of 50 nm through 200 nm.

In implementation, the first transparent conductive layer (61) is made of Ag, Au, Pt or Pd, and preferably has a thickness of 50 nm through 200 nm, wherein Ag, Au, Pt or Pd is evaporated or sputtered to form the first transparent conductive layer (61).

In implementation, the second transparent conductive layer (62) is made of Ag, Au, Pt or Pd, and preferably has a thickness of 50 nm through 200 nm, wherein Ag, Au, Pt or Pd is evaporated or sputtered to form the second transparent conductive layer (62).

In implementation, the first insulation layer (71) and the second insulation layer (72) are made of polyesters polymer, wherein polyesters polymer is coated and printed, and then dried by hot air for 10 minutes with a temperature of 90° C. through 140° C. to form the first insulation layer (71) and the second insulation layer (72).

The present disclosure further discloses a manufacturing method of a composite photovoltaic structure, which comprises steps as shown in FIG. 4 through FIG. 12, and the steps are described as follows.

a. forming a transparent electrode material (50), and providing a transparent substrate (20), wherein the transparent electrode material (50) with a predetermined thickness is disposed on a top surface of the transparent substrate (20).

b. forming a first photovoltaic unit (30), wherein materials of layers of the first photovoltaic unit (30) are sequentially formed on the transparent electrode material (50), a top surface layer (33) and a bottom surface layer (31) of the first photovoltaic unit (30) are respectively a transparent electron transport layer and a transparent hole transport layer, and a transparent activation layer (32) is formed between the top surface layer (33) and the bottom surface layer (31) of the first photovoltaic unit (30).

forming a first insulation layer (71), wherein the top surface layer of the first photovoltaic unit (30) is etched to form at least one first insulation material channel (21) which penetrates the transparent electrode material (50), and the first insulation material channel (21) is filled with insulation material, such that the first insulation layer (71) is formed in the first insulation material channel (21), and the first insulation layer (71) separates the transparent electrode material (50) into a first transparent electrode layer (51) and a second transparent electrode layer (52), wherein the first transparent electrode layer (51) is disposed under the first photovoltaic unit (30), and the second transparent electrode layer (52) is disposed outside the first photovoltaic unit (30). The etching can be performed by a laser, for example, a laser emits a laser beam on the top surface layer (33) of the first photovoltaic unit (30) to form at least one first insulation material channel (21) which penetrates the transparent electrode material (50).

d. forming a first transparent conductive layer (61), wherein a side of the first insulation layer (71) is etched to form a first transparent conductive material channel (22) which penetrates the transparent electrode material (50) from the top surface layer (33) of the first photovoltaic unit (30), and transparent conductive material is disposed on the top surface layer (33) of the first photovoltaic unit (30) and in the first transparent conductive material channel (22), such that the first transparent conductive layer (61) is formed, wherein the first transparent conductive layer (61) is disposed on the top surface layer (33) of the first photovoltaic unit (30), extends along the side of the first insulation layer (71), and is electrically connected to the first transparent electrode layer (51).

e. forming a second photovoltaic unit (40), wherein materials of layers of the second photovoltaic unit (40) are sequentially formed on the first transparent conductive layer (61) which is disposed on the first photovoltaic unit (30), a top surface layer (43) and a bottom surface layer (41) of the second photovoltaic unit (40) are respectively a transparent hole transport layer and a transparent electron transport layer, and a transparent activation layer (42) is disposed between the top surface layer (43) and the bottom surface layer (41) of the second photovoltaic unit (40).

f. forming a second insulation layer (72), wherein the top surface layer (43) of the second photovoltaic unit (40) is etched to form at least one second insulation material channel (23) which penetrates the transparent electrode material (50), and the second insulation material channel (23) is filled with insulation material, such that the second insulation layer (72) is formed in the second insulation material channel (23).

g. forming a second transparent conductive layer (62), wherein a side of the second insulation layer (72) is etched to form a second transparent conductive material channel (24) which penetrates the transparent electrode material (50) from the top surface layer (43) of the second photovoltaic unit (40), and transparent conductive material is disposed on the top surface layer (43) of the second photovoltaic unit (40) and in the second transparent conductive material channel (24), such that the second transparent conductive layer (62) is formed, wherein the second transparent conductive layer (62) is disposed on the top surface layer (43) of the second photovoltaic unit (40), extends along the side of the second insulation layer (72), and is electrically connected to the second transparent electrode layer (52).

h. forming a product of the composite photovoltaic structure, wherein a top surface of the second transparent conductive layer (62) is etched to form a conductive channel (25) which penetrates the transparent electrode material (50), so as to separate the composite photovoltaic structures on the transparent substrate (20), wherein the composite photovoltaic structure has the first photovoltaic unit (30) and the second photovoltaic unit (40) stacked on the first photovoltaic unit (30), and both of them are disposed on the transparent substrate (20) and electrically connected to each other in parallel, as shown in FIG. 2.

Similarly, in implementation of the manufacturing method of the composite photovoltaic structure, an optical hardened layer (80) (shown in FIG. 3) can be disposed on the top surface of the transparent substrate (20), and the transparent electrode material (50) is disposed on the optical hardened layer (80). The optical hardened layer (80) is one or a combination of acrylic, epoxy and silicon dioxide, and preferably has a thickness of 1 μm through 5 μm. By disposing the optical hardened layer (80), the mechanical strength of the composite photovoltaic structure can be increased Similarly, in implementation of the manufacturing method of the composite photovoltaic structure, the first photovoltaic unit (30) and the second photovoltaic unit (40) are organic photovoltaic units; or alternatively, the first photovoltaic unit (30) and the second photovoltaic unit (40) are perovskite photovoltaic units; or alternatively, the first photovoltaic unit (30) is an organic photovoltaic unit, and the second photovoltaic unit (40) is a perovskite photovoltaic unit; or alternatively, the first photovoltaic unit (30) is a perovskite photovoltaic unit, and the second photovoltaic unit (40) is an organic photovoltaic unit.

Similarly, in implementation of the manufacturing method of the composite photovoltaic structure, the first photovoltaic unit (30) and the second photovoltaic unit (40) are organic photovoltaic units in one embodiment. The transparent electron transport layers of the first photovoltaic unit (30) and the second photovoltaic unit (40) are mainly made of PEI or PEIE, and preferably have thicknesses of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layers of the first photovoltaic unit (30) and the second photovoltaic unit (40). The transparent hole transport layers of the first photovoltaic unit (30) and the second photovoltaic unit (40) are mainly made of a combination of PEDOT:PSS (Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS) (i.e. the combination of PEDOT and PSS), and preferably have thicknesses of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layers of the first photovoltaic unit (30) and the second photovoltaic unit (40). The transparent activation layers (32), (42) of the first photovoltaic unit (30) and the second photovoltaic unit (40) are made of a combination of P3HT/PCBM (i.e. the combination of P3HT and PCBM) or a combination of PCPDTBT/PCBM (poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) (i.e. the combination of PCPDTBT and PCBM) which is diluted with solvent, and preferably have thicknesses of 100 nm through 500 nm, wherein the combination of P3HT/PCBM is a mixture comprising a polymer semiconductor of a plurality of poly(3-hexylthiophene)(P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layers (32), (42) of the first photovoltaic unit (30) and the second photovoltaic unit (40).

Similarly, in implementation of the manufacturing method of the composite photovoltaic structure, the first photovoltaic unit (30) and the second photovoltaic unit (40) are perovskite photovoltaic units in one another embodiment. The transparent electron transport layers of the first photovoltaic unit (30) and the second photovoltaic unit (40) are made of a combination of PEDOT:PSS (i.e. the combination of PEDOT and PSS), or made of P3HT (poly(3-hexylthiophene)) or PTAA (poly(bis(4-phenyl)(2,4,6-trimethylphenyl)amine)), and preferably have thicknesses of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layers of the first photovoltaic unit (30) and the second photovoltaic unit (40). The transparent hole transport layers of the first photovoltaic unit (30) and the second photovoltaic unit (40) are made of a combination of PDPP3T:PCBM (i.e. the combination of PDPP3T and PCBM) which is diluted with solvent, and preferably have thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layers of the first photovoltaic unit (30) and the second photovoltaic unit (40). The transparent activation layers (32), (42) of the first photovoltaic unit (30) and the second photovoltaic unit (40) are made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layers of the first photovoltaic unit (30) and the second photovoltaic unit (40).

Similarly, in implementation of the manufacturing method of the composite photovoltaic structure, the first photovoltaic unit (30) is an organic photovoltaic unit, and the second photovoltaic unit (40) is a perovskite photovoltaic unit in one another embodiment. The transparent electron transport layer of the first photovoltaic unit (30) is mainly made of PEI or PEIE, and preferably has a thickness of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layer of the first photovoltaic unit (30). The transparent hole transport layer of the first photovoltaic unit (30) is mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably has a thickness of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layer of the first photovoltaic unit (30). The transparent activation layer of the first photovoltaic unit (30) is made of a combination of P3HT/PCBM or a combination of PCPDTBT/PCBM (poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) which is diluted with solvent, and preferably has a thickness of 100 nm through 500 nm, wherein the combination of P3HT/PCBM is a mixture comprising a polymer semiconductor of a plurality of poly(3-hexylthiophene)(P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layer of the first photovoltaic unit (30). The transparent electron transport layer of the second photovoltaic unit (40) is made of a combination of PEDOT:PSS, or made of P3HT (poly(3-hexylthiophene)) or PTAA (poly(bis(4-phenyl)(2,4,6-trimethylphenyl)amine)), and preferably has a thickness of 100 nm through 500 nm, wherein the combination of PEDOT:PSS, P3HT or PTAA is coated via slits and then dried by nitrogen atmosphere for 5 minutes with a temperature of 90° C. through 140° C. to form the transparent electron transport layer of the second photovoltaic unit (40). The transparent hole transport layer of the second photovoltaic unit (40) is made of a combination of PDPP3T:PCBM which is diluted with solvent, and preferably has a thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layer of the second photovoltaic unit (40). The transparent activation layer of the second photovoltaic unit is made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the second photovoltaic unit (40).

Similarly, in implementation of the manufacturing method of the composite photovoltaic structure, the first photovoltaic unit (30) is a perovskite photovoltaic unit, and the second photovoltaic unit (40) is an organic photovoltaic unit in one another embodiment. The transparent electron transport layer of the first photovoltaic unit (30) is made of a combination of PEDOT:PSS, or made of P3HT (poly(3-hexylthiophene)) or PTAA (poly(bis(4-phenyl)(2,4,6-trimethylphenyl)amine)), and preferably has a thickness of 100 nm through 500 nm, wherein the combination of PEDOT: PSS, P3HT or PTAA is coated via slits and then dried by nitrogen atmosphere for 5 minutes with a temperature of 90° C. through 140° C. to form the transparent electron transport layer of the first photovoltaic unit (30). The transparent hole transport layer of the first photovoltaic unit (30) is made of a combination of PDPP3T:PCBM which is diluted with solvent, and preferably has a thicknesses of 1 nm through 100 nm, wherein the combination of PDPP3T:PCBM is diluted with the solvent, coated via slits and then dried by nitrogen atmosphere for 5 minutes with a temperature of 90° C. through 140° C. to form the transparent hole transport layer of the first photovoltaic unit (30). The transparent activation layer of the first photovoltaic unit (30) is made of one or a combination of $CH_3NH_3PbI_3$, $CsPbBr_3$, $CsPbI_3$, $FAPbI_3$ (formamidinium lead iodide) and $FAPbBr_3$ (formamidinium lead bromide) which is diluted with solvent, and preferably have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the first photovoltaic unit (30). The transparent electron transport layer of the second photovoltaic unit (40) is mainly made of PEI or PEIE, and preferably has a thickness of 0.5 nm through 10 nm, wherein PEI (polyethylenimine) or PEIE (polyethylenimine ethoxylated) is coated via slits and then dried by hot air for 3 minutes with a temperature of 90° C. through 140° C. to form the transparent electron transport layer of the second photovoltaic unit (40). The transparent hole transport layer of the second photovoltaic unit (40) is mainly made of a combination of PEDOT:PSS(Poly(3,4-ethylenedioxythiophene)-poly(styrenesulfonate)) which is diluted with solvent and comprises a mixture of a polymer of a plurality of EDOT (3,4-ethylenedioxythiophene monomer) and a plurality of sodium-p-styrenesulfonate (PSS), and preferably has a thickness of 100 nm through 500 nm, wherein the combination of PEDOT:PSS is diluted with alcohol or other solvent, coated via slits and then dried by nitrogen atmosphere for 5 minutes with a temperature of 90° C. through 140° C. to form the transparent hole transport layer of the second photovoltaic unit (40). The transparent activation layer of the second photovoltaic unit (40) is made of a combination of P3HT/PCBM or a combination of PCPDTBT/PCBM (poly[2,6-(4,4-bis-(2-ethylhexyl)-4H-cyclopenta[2,1-b;3,4-b']dithiophene)-alt-4,7-(2,1,3-benzothiadiazole)]: phenyl-$C_{61}$-butyric acid methyl ester) which is diluted with solvent, and preferably has a thickness of 100 nm through 500 nm, wherein the combination of P3HT/PCBM is a mixture comprising a polymer semiconductor of a plurality of poly(3-hexylthiophene)(P3HT (p-type material) and a plurality of phenyl-$C_{61}$-butyric acid methyl ester (PCBM), the combination of P3HT/PCBM or the combination of PCPDTBT/PCBM is diluted with ortho-xylene, coated via slits and then dried by nitrogen atmosphere for 3 minutes with a temperature of 90° C. through 140° C. to form the transparent activation layer of the second photovoltaic unit (40).

Similarly, in implementation of the manufacturing method of the composite photovoltaic structure, ITO (indium tin oxide), IZO (indium doped zinc oxide) or AZO (aluminum doped zinc oxide) is evaporated or sputtered on the transparent substrate (20) to form the first transparent electrode layer (51) and the second transparent electrode layer (52), which preferably have thicknesses of 50 nm through 200 nm.

Similarly, in implementation of the manufacturing method of the composite photovoltaic structure, the first transparent conductive layer (61) is made of Ag, Au, Pt or Pd, and preferably has a thickness of 50 nm through 200 nm, wherein Ag, Au, Pt or Pd is evaporated or sputtered to form the first transparent conductive layer (61).

Similarly, in implementation of the manufacturing method of the composite photovoltaic structure, the second transparent conductive layer (62) is made of Ag, Au, Pt or Pd, and preferably has a thickness of 50 nm through 200 nm, wherein Ag, Au, Pt or Pd is evaporated or sputtered to form the second transparent conductive layer (62).

Similarly, in implementation of the manufacturing method of the composite photovoltaic structure, the first insulation layer (71) and the second insulation layer (72) are made of polyesters polymer, wherein polyesters polymer is coated and printed, and then dried by hot air for 10 minutes with a temperature of 90° C. through 140° C. to form the first insulation layer (71) and the second insulation layer (72).

Figure 1:
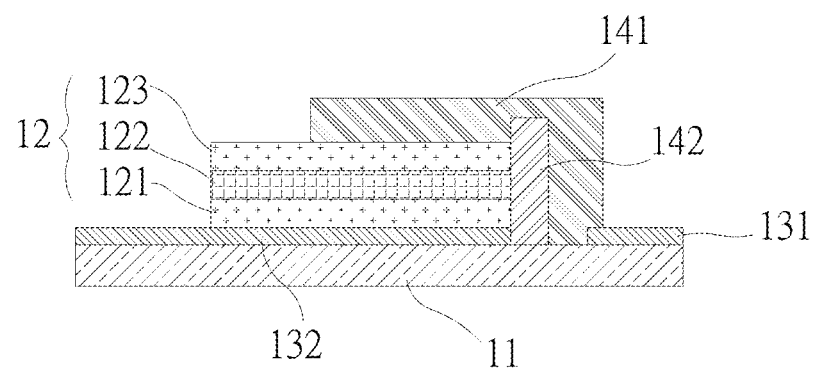
FIG. 1 is a sectional view of a conventional photovoltaic structure.

The detection results of embodiments 1-3, comparative example 1 are shown as follows. By using the composite photovoltaic structure and the manufacturing method of the composite photovoltaic structure, ten composite photovoltaic structures (having a dimension of 2.5 cm length and 0.5 cm width) are made and electrically connected in series to form the photovoltaic battery assemblies of embodiments 1-3; other photovoltaic structures of FIG. 1 in the prior art are made electrically connected in series to form the photovoltaic battery assembly of the comparative example 1. The photovoltaic battery assemblies are formed by the gas barrier package, and disposed on the substrate with the light illumination source on the two sides of the substrate, wherein the lighting environment has 1000lux, the open voltages (V) and the short currents over normalized unit area (I/$cm^2$) of the photovoltaic battery assemblies are measured and shown in Table 1.

TABLE 1

| | | embodiment 1 | embodiment 2 | embodiment 3 | comparative example 1 |
|---|---|---|---|---|---|
| the composite photovoltaic structure of the present disclosure | transparent substrate(20) | transparent PET film/25 μm | | | |
| | second transparent electrode layer(52) | ITO/thickness of 60 nm | | | |
| | first transparent electrode layer(51) | ITO/thickness of 60 nm | | | |
| first photovoltaic unit(30) | bottom surface layer(31) (transparent hole transport layer) | PEDOT:PSS thickness of 300 nm | PDPP3T:PCBM thickness of 50 nm | PEDOT:PSS thickness of 300 nm | |
| | transparent activation layer(32) | P3HT/PCBM thickness of 300 nm | $CH_3NH_3PbI_3$ thickness of 500 nm | P3HT/PCBM thickness of 300 nm | |
| | top surface layer(33) (transparent electron transport layer) | PEI/ thickness of 5 nm | PEDOT:PSS thickness of 300 nm | PEI/ thickness of 5 nm | |
| | first insulation layer(71) | polyesters polymer/thickness of 1 μm | | | |
| | first transparent conductive layer(61) | Ag/thickness of 100 nm | | | |
| second photovoltaic unit(40) | top surface layer (43) transparent hole ( transport layer) | PEDOT:PSS thickness of 300 nm | PDPP3T:PCBM thickness of 50 nm | PDPP3T:PCBM thickness of 50 nm | |
| | transparent activation layer(42) | P3HT/PCBM thickness of 300 nm | $CH_3NH_3PbI_3$ thickness of 500 nm | $CH_3NH_3PbI_3$ thickness of 500 nm | |
| | bottom surface layer(41) (transparent electron transport layer) | PEI/ thickness of 5 nm | PEDOT:PSS thickness of 300 nm | PEDOT:PSS thickness of 300 nm | |
| | second insulation layer(72) | polyesters polymer/thickness of 1 μm | | | |
| | second transparent conductive layer(62) | Ag/thickness of 100 nm | | | |
| conventional photovoltaic structure | transparent substrate(11) | | | | transparent PET film/ thickness of 25 μm |
| | second transparent electrode layer(132) | | | | ITO/ thickness of 60 nm |
| | first transparent electrode layer(131) | | | | ITO/ thickness of 60 nm |
| | bottom surface layer(121) (transparent hole transport layer) | | | | PEDOT:PSS thickness of 300 nm |
| | transparent activation layer(122) | | | | P3HT/PCBM thickness of 300 nm |
| | top surface layer(123) (transparent electron transport layer) | | | | PEI/ thickness of 5 nm |
| | (142) insulation layer | | | | polyesters polymer/ thickness of 1 μm |
| | (141) transparent conductive layer | | | | Ag/ thickness of 100 nm |
| detection results | open voltage (V) | 5.3 | 5.8 | 5.7 | 5.2 |
| | short currents over unit area ($\mu A/cm^2$) | 200 | 1600 | 850 | 105 |

In embodiment 1, the first photovoltaic unit (30) and the second photovoltaic unit (40) are organic photovoltaic units; in embodiment 2, the first photovoltaic unit (30) and the second photovoltaic unit (40) are perovskite photovoltaic units; in embodiment 3, the first photovoltaic unit (30) is an organic photovoltaic unit and the second photovoltaic unit (40) is a perovskite photovoltaic unit. In comparative example 1, the conventional photovoltaic unit is the organic photovoltaic unit. It is obvious that, the open voltages (V) and the short currents over normalized unit area (I/cm$^2$) of embodiments 1-3 are better than those of comparative example 1.

To sum up, by electrically connecting the first photovoltaic unit and the second photovoltaic unit in parallel on the transparent substrate, the composite photovoltaic structure has a photoelectric reaction area of a significantly improved omnidirectional concentration gain, an efficiently induced current and a low manufacturing cost, without affecting the whole structure thickness. Thus, the composite photovoltaic structure meets the demand of small size product.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A manufacturing method of a composite photovoltaic structure, comprising steps of:
    a. forming a transparent electrode material, and providing a transparent substrate, wherein the transparent electrode material with a predetermined thickness is disposed on a top surface of the transparent substrate;
    b. forming a first photovoltaic unit, wherein materials of layers of the first photovoltaic unit are sequentially formed on the transparent electrode material, a top surface layer and a bottom surface layer of the first photovoltaic unit are respectively a transparent electron transport layer and a transparent hole transport layer, and a transparent activation layer is formed between the top surface layer and the bottom surface layer of the first photovoltaic unit;
    c. forming a first insulation layer, wherein the top surface layer of the first photovoltaic unit is etched to form at least one first insulation material channel which penetrates the transparent electrode material, and the first insulation material channel is filled with insulation material, such that the first insulation layer is formed in the first insulation material channel, and the first insulation layer separates the transparent electrode material into a first transparent electrode layer and a second transparent electrode layer, wherein the first transparent electrode layer is disposed under the first photovoltaic unit, and the second transparent electrode layer is disposed outside the first photovoltaic unit;
    d. forming a first transparent conductive layer, wherein one side of the first insulation layer is etched to form a first transparent conductive material channel which penetrates the transparent electrode material from the top surface layer of the first photovoltaic unit, and transparent conductive material is disposed on the top surface layer of the first photovoltaic unit and in the first transparent conductive material channel, such that the first transparent conductive layer is formed, wherein the first transparent conductive layer is disposed on the top surface layer of the first photovoltaic unit, extends along the one side of the first insulation layer, and is electrically connected to the first transparent electrode layer;
    e. forming a second photovoltaic unit, wherein materials of layers of the second photovoltaic unit are sequentially formed on the first transparent conductive layer which is disposed on the first photovoltaic unit, a top surface layer and a bottom surface layer of the second photovoltaic unit are respectively a transparent hole transport layer and a transparent electron transport layer, and a transparent activation layer is disposed between the top surface layer and the bottom surface layer of the second photovoltaic unit;
    f. forming a second insulation layer, wherein the top surface layer of the second photovoltaic unit is etched to form at least one second insulation material channel which penetrates the transparent electrode material, and the second insulation material channel is filled with insulation material, such that the second insulation layer is formed in the second insulation material channel;
    g. forming a second transparent conductive layer, wherein one side of the second insulation layer is etched to form a second transparent conductive material channel which penetrates the transparent electrode material from the top surface layer of the second photovoltaic unit, and transparent conductive material is disposed on the top surface layer of the second photovoltaic unit and in the second transparent conductive material channel, such that the second transparent conductive layer is formed, wherein the second transparent conductive layer is disposed on the top surface layer of the second photovoltaic unit, extends along the one side of the second insulation layer, and is electrically connected to the second transparent electrode layer; and
    h. forming a product of the composite photovoltaic structure, wherein a top surface of the second transparent conductive layer is etched to form a conductive channel which penetrates the transparent electrode material, so as to separate composite photovoltaic structures on the transparent substrate, wherein the composite photovoltaic structure has the first photovoltaic unit and the second photovoltaic unit stacked on the first photovoltaic unit, and both of them are disposed on the transparent substrate and electrically connected to each other in parallel.

2. The manufacturing method of the composite photovoltaic structure according to claim 1, wherein an optical hardened layer is disposed on the top surface of the transparent substrate, and the transparent electrode material is disposed on the optical hardened layer.

3. The manufacturing method of the composite photovoltaic structure according to claim 2, wherein the optical hardened layer is one or a combination of acrylic, epoxy and silicon dioxide, and has a thickness of 1 μm through 5 μm.

4. The manufacturing method of the composite photovoltaic structure according to claim 1, wherein the first photovoltaic unit and the second photovoltaic unit are organic photovoltaic units.

5. The manufacturing method of the composite photovoltaic structure according to claim 1, wherein the first photovoltaic unit and the second photovoltaic unit are perovskite photovoltaic units.

6. The manufacturing method of the composite photovoltaic structure according to claim 1, wherein the first photovoltaic unit is an organic photovoltaic unit, and the second photovoltaic unit is a perovskite photovoltaic unit.

7. The manufacturing method of the composite photovoltaic structure according to claim 1, wherein the first photovoltaic unit is a perovskite photovoltaic unit, and the second photovoltaic unit is an organic photovoltaic unit.

8. The manufacturing method of the composite photovoltaic structure according to claim 1, wherein the first photovoltaic unit and the second photovoltaic unit are organic photovoltaic units; the transparent electron transport layers of the first photovoltaic unit and the second photovoltaic unit are made of PEI or PEIE, and have thicknesses of 0.5 nm through 10 nm, wherein PEI or PEIE is coated via slits and then dried by hot air for 3 minutes with a temperature of 90° C. through 140° C. to form the transparent electron transport layers of the first photovoltaic unit and the second photovoltaic unit; the transparent hole transport layers of the first photovoltaic unit and the second photovoltaic unit are made of a combination of PEDOT and PSS which is diluted with solvent, and have thicknesses of 100 nm through 500 nm, wherein the combination of PEDOT and PSS is diluted with alcohol, coated via slits and then dried by nitrogen atmosphere for 5 minutes with a temperature of 90° C. through 140° C. to form the transparent hole transport layers of the first photovoltaic unit and the second photovoltaic unit; the transparent activation layers of the first photovoltaic unit and the second photovoltaic unit are made of a combination of P3HT and PCBM or a combination of PCPDTBT and PCBM which is diluted with solvent, and have thicknesses of 100 nm through 500 nm, wherein the combination of P3HT and PCBM or the combination of PCPDTBT and PCBM is diluted with ortho-xylene, coated via slits and then dried by nitrogen atmosphere for 3 minutes with a temperature of 90° C. through 140° C. to form the transparent activation layers of the first photovoltaic unit and the second photovoltaic unit.

9. The manufacturing method of the composite photovoltaic structure according to claim 1, wherein the first photovoltaic unit and the second photovoltaic unit are perovskite photovoltaic units; the transparent electron transport layers of the first photovoltaic unit and the second photovoltaic unit are made of a combination of PEDOT and PSS, or made of P3HT or PTAA, and have thicknesses of 100 nm through 500 nm, wherein the combination of PEDOT and PSS, P3HT or PTAA is coated via slits and then dried by nitrogen atmosphere for 5 minutes with a temperature of 90° C. through 140° C. to form the transparent electron transport layers of the first photovoltaic unit and the second photovoltaic unit; the transparent hole transport layers of the first photovoltaic unit and the second photovoltaic unit are made of a combination of PDPP3T and PCBM which is diluted with solvent, and have thicknesses of 1 nm through 100 nm, wherein the combination of PDPP3T and PCBM is diluted with the solvent, coated via slits and then dried by nitrogen atmosphere for 5 minutes with a temperature of 90° C. through 140° C. to form the transparent hole transport layers of the first photovoltaic unit and the second photovoltaic unit; the transparent activation layers of the first photovoltaic unit and the second photovoltaic unit are made of one or a combination of $CH_3NH_3PbI_3$, $CsPbBr_3$, $CsPbI_3$, $FAPbI_3$ and $FAPbBr_3$ which is diluted with solvent, and have thicknesses of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layers of the first photovoltaic unit and the second photovoltaic unit.

10. The manufacturing method of the composite photovoltaic structure according to claim 1, wherein the first photovoltaic unit is an organic photovoltaic unit, and the second photovoltaic unit is a perovskite photovoltaic unit; the transparent electron transport layer of the first photovoltaic unit is made of PEI or PEIE, and has a thickness of 0.5 nm through 10 nm, wherein PEI or PEIE is coated via slits and then dried by hot air for 3 minutes with a temperature of 90° C. through 140° C. to form the transparent electron transport layer of the first photovoltaic unit; a transparent hole transport layer of the first photovoltaic unit is made a combination of PEDOT and PSS which is diluted with solvent, and has a thickness of 100 nm through 500 nm, wherein the combination of PEDOT and PSS is diluted with alcohol, coated via slits and then dried by nitrogen atmosphere for 5 minutes with a temperature of 90° C. through 140° C. to form the transparent hole transport layer of the first photovoltaic unit; the transparent activation layer of the first photovoltaic unit is made of a combination of P3HT and PCBM or a combination of PDPDTBT and PCBM which is diluted with solvent, and has a thickness of 100 nm through 500 nm, wherein the combination of P3HT and PCBM or the combination of PCPDTBT and PCBM is diluted with orthoxylene, coated via slits and then dried by nitrogen atmosphere for 3 minutes with a temperature of 90° C. through 140° C. to form the transparent activation layer of the first photovoltaic unit; the transparent electron transport layer of the second photovoltaic unit is made of a combination of PEDOT and PSS, or made of P3HT or PTAA, and has a thickness of 100 nm through 500 nm, wherein the combination of PEDOT and PSS, P3HT or PTAA is coated via slits and then dried by nitrogen atmosphere for 5 minutes with a temperature of 90° C. through 140° C. to form the transparent electron transport layer of the second photovoltaic unit; the transparent hole transport layer of the second photovoltaic unit is made of a combination of PDPP3T and PCBM which is diluted with solvent, and has a thickness of 1 nm through 100 nm, wherein the combination of PDPP3T and PCBM is diluted with the solvent, coated via slits and then dried by nitrogen atmosphere for 5 minutes with a temperature of 90° C. through 140° C. to form the transparent hole transport layer of the second photovoltaic unit; the transparent activation layer of the second photovoltaic unit is made of one or a combination of $CH_3NH_3PbI_3$, $CsPbBr_3$, $CsPbI_3$, $FAPbI_3$ and $FAPbBr_3$ which is diluted with solvent, and has a thickness of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the second photovoltaic unit.

11. The manufacturing method of the composite photovoltaic structure according to claim 1, wherein the first photovoltaic unit is a perovskite photovoltaic unit, and the second photovoltaic unit is an organic photovoltaic unit; the transparent electron transport layer of the first photovoltaic unit is made of a combination of PEDOT and PSS, or made of P3HT or PTAA, and has a thickness of 100 nm through 500 nm, wherein the combination of PEDOT and PSS, P3HT or PTAA coated via slits and then dried by nitrogen atmosphere for 5 minutes with a temperature of 90° C. through 140° C. to form the transparent electron transport layer of the first photovoltaic unit; the transparent hole transport layer of the first photovoltaic unit is made of a combination of PDPP3T and PCBM which is diluted with solvent, and has a thickness of 1 nm through 100 nm, wherein the combination of PDPP3T and PCBM is diluted with the solvent, coated via slits and then dried by nitrogen atmosphere for 5 minutes with a temperature of 90° C. through 140° C. to form the transparent hole transport layer of the first photovoltaic unit; the transparent activation layer of the first photovoltaic unit is made of one or a combination of $CH_3NH_3PbI_3$, $CsPbBr_3$, $CsPbI_3$, $FAPbI_3$ and $FAPbBr_3$ which is diluted with solvent, and has a thickness of 200 nm through 800 nm, wherein the one or combination of $CH_3NH_3PbI_3$, $CsPbBr_3$, $CsPbI_3$, $FAPbI_3$ and $FAPbBr_3$ is diluted with the solvent, coated via slits and then dried by nitrogen atmosphere for 5 minutes with a temperature of 90° C. through 140° C. to form the transparent activation layer of the first photovoltaic unit; the transparent electron transport layer of the second photovoltaic unit is made of PEI or PEIE, and has a thickness of 0.5 nm through 10 nm, wherein PEI or PEIE is coated via slits and then dried by hot air for 3 minutes with a temperature of 90° C. through 140° C. to form the transparent electron transport layer of the second photovoltaic unit; a transparent hole transport layer of the second photovoltaic unit is made a combination of PEDOT and PSS which is diluted with solvent, and has a thickness of 100 nm through 500 nm, wherein the combination of PEDOT and PSS is diluted with alcohol, coated via slits and then dried by nitrogen atmosphere for 5 minutes with a temperature of 90° C. through 140° C. to form the transparent hole transport layer of the second photovoltaic unit; the transparent activation layer of the second photovoltaic unit is made of a combination of P3HT and PCBM or a combination of PDPDTBT and PCBM which is diluted with solvent, and has a thickness of 100 nm through 500 nm, wherein the combination of P3HT and PCBM or the combination of PCPDTBT and PCBM is diluted with ortho-xylene, coated via slits and then dried by nitrogen atmosphere for 3 minutes with a temperature of 90° C. through 140° C. to form the transparent activation layer of the second photovoltaic unit.

12. The manufacturing method of the composite photovoltaic structure according to claim 1, wherein ITO, IZO or AZO is evaporated or sputtered on the transparent substrate to form the transparent electrode material with a thickness of 50 nm through 200 nm.

13. The manufacturing method of the composite photovoltaic structure according to claim 1, wherein the first transparent conductive layer is made of Ag, Au, Pt or Pd, and has a thickness of 50 nm through 200 nm, wherein Ag, Au, Pt or Pd is evaporated or sputtered to form the first transparent conductive layer.

14. The manufacturing method of the composite photovoltaic structure according to claim 1, wherein the second transparent conductive layer is made of Ag, Au, Pt or Pd, and has a thickness of 50 nm through 200 nm, wherein Ag, Au, Pt or Pd is evaporated or sputtered to form the second transparent conductive layer.

15. The manufacturing method of the composite photovoltaic structure according to claim 1, wherein the first insulation layer and the second insulation layer are made of polyesters polymer, wherein polyesters polymer is coated and printed, and then dried by hot air for 10 minutes with a temperature of 90° C. through 140° C. to form the first insulation layer and the second insulation layer.

* * * * *